(12) United States Patent
Wolpert et al.

(10) Patent No.: US 12,176,289 B2
(45) Date of Patent: Dec. 24, 2024

(54) SEMICONDUCTOR DEVICE DESIGN MITIGATING LATCH-UP

(71) Applicant: International Business Machines Corporation, Armonk, NY (US)

(72) Inventors: David Wolpert, Poughkeepsie, NY (US); Leon Sigal, Monsey, NY (US); Terence Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 17/656,368

(22) Filed: Mar. 24, 2022

(65) Prior Publication Data

US 2023/0307363 A1    Sep. 28, 2023

(51) Int. Cl.
*H01L 23/528* (2006.01)
*H01L 27/092* (2006.01)

(52) U.S. Cl.
CPC ........ *H01L 23/5286* (2013.01); *H01L 27/092* (2013.01)

(58) Field of Classification Search
CPC .............. H01L 23/5286; H01L 27/092; H01L 27/0207; H01L 27/0251; H01L 27/0262; H01L 2027/1189; H01L 27/0921
See application file for complete search history.

(56) References Cited

U.S. PATENT DOCUMENTS

| 6,818,929 B2 | 11/2004 | Tsutsumi et al. |
| 9,472,547 B2 | 10/2016 | Tsumura |
| 9,905,560 B2 | 2/2018 | Jayapal et al. |

(Continued)

FOREIGN PATENT DOCUMENTS

| CN | 109686735 A | 4/2019 |
| JP | S58162128 A | 9/1983 |

(Continued)

OTHER PUBLICATIONS

PCT, Notification of Transmittal of The International Search Report and The Written Opinion of The International Searching Authority, or The Declaration for Application PCT/EP2023/056125 dated Jun. 26, 2023.

(Continued)

*Primary Examiner* — Kimberly N Rizkallah
*Assistant Examiner* — Nicholas B Michaud
(74) *Attorney, Agent, or Firm* — Patterson + Sheridan, LLP

(57) ABSTRACT

Apparatus for mitigating latch-up within semiconductor devices. A semiconductor device includes a first conductor, a second conductor, and a first gate conductor. The first conductor extends in a first direction, receives a first power supply signal, and is connected to a first electrode. The second conductor extends in the first direction, receives a second power supply signal different from the first power supply signal, and is connected to a second electrode. The first conductor is offset from the second conductor in a second direction perpendicular to the first direction in a top-down view to mitigate formation of parasitic devices within the semiconductor device electrically connecting the first conductor with the second conductor. The first gate conductor is disposed adjacent to the first conductor and the second conductor, is disposed on the first electrode and the second electrode, and receives an input signal.

20 Claims, 6 Drawing Sheets

(56) References Cited

U.S. PATENT DOCUMENTS

| | | | |
|---|---|---|---|
| 10,740,527 B2 | 8/2020 | Farbiz et al. | |
| 2004/0222422 A1* | 11/2004 | Sun | H01L 27/092 |
| | | | 257/E27.111 |
| 2007/0228424 A1* | 10/2007 | Igarashi | H01L 29/41758 |
| | | | 257/256 |
| 2009/0072320 A1* | 3/2009 | Kim | H01L 27/0207 |
| | | | 257/369 |
| 2015/0035070 A1* | 2/2015 | Chiang | H01L 27/0207 |
| | | | 257/369 |
| 2023/0268343 A1* | 8/2023 | Wong | H01L 27/088 |
| | | | 257/368 |

FOREIGN PATENT DOCUMENTS

| | | |
|---|---|---|
| JP | S62256467 A | 11/1987 |
| JP | 2001313366 A | 11/2001 |
| JP | 4658360 B2 | 3/2011 |
| WO | 8002470 A1 | 11/1980 |

OTHER PUBLICATIONS

Authors et al., "Cell Optimization Exploitng Diffusion Break Strain Distance to Active FETs," ip.com, IP.com No. IPCOM000271045D, Dated: Oct. 4, 2022, pp. 1-4.
U.S. Appl. No. 17/480,551, filed Sep. 21, 2021.
U.S. Appl. No. 17/399,397, filed Aug. 11, 2021.
U.S. Appl. No. 17/401,441, filed Aug. 13, 2021.
U.S. Appl. No. 117/411,113, filed Aug. 25, 2021.
U.S. Appl. No. 17/479,246, filed Sep. 20, 2021.
IPCOM—Authors et al., "Region-Based Line-End Optimization for Achieving DFM Line End Extensions while Avoiding 2-step / 3-step / 4-step Issues," IP.Com, Dated: Nov. 16, 2021, pp. 1-3.
Authors et al., "A Method for Optizimizing Decoupling Capacitor Efficiency in Densely Routed Regions," ip.com, IP.com No. IPCOM000269202D, Dated: Mar. 29, 2022, pp. 1-4.

* cited by examiner

SEMICONDUCTOR DEVICE DESIGN MITIGATING LATCH-UP

BACKGROUND

The present invention relates to semiconductor devices, and more specifically, to mitigating latch-up in semiconductor devices.

Semiconductor devices experience various defects that may lead to failures. In one instance, a semiconductor device may experience latch-up, resulting in one or more corresponding failures. These failures may include complete failure of the semiconductor device. Latch-up is the condition when a low impedance path is formed between a power supply rail and a ground supply rail, allowing for current flow between the supply rails. In complementary metal-oxide-semiconductor (CMOS) devices, parasitic transistors are formed within the CMOS devices, providing a current path between the supply rails, increasing the possibility that latch-up may occur. When a sharp increase in the voltage on either of the supply rails occurs, the parasitic transistors are turned on, forming a feedback loop within the CMOS device. The feedback loop creates a path for current to flow between the power rails, causing latch-up and a failure within the CMOS devices.

In the following, an improved semiconductor device is described that mitigates latch-up within semiconductor devices by increasing the distance between power supply rail nodes within the semiconductor devices.

SUMMARY

According to one embodiment of the present invention, a semiconductor device includes a first conductor, a second conductor, and a first gate conductor. The first conductor extends in a first direction and receives a first power supply signal. The first conductor is connected to a first electrode. The second conductor extends in the first direction and receives a second power supply signal. The second conductor is connected to a second electrode. The first conductor is offset from the second conductor in a second direction perpendicular to the first direction in a top-down view to mitigate formation of parasitic devices within the semiconductor device electrically connecting the first conductor with the second conductor. The first voltage value of the first power supply signal is greater than a second voltage of the second power supply signal. The first gate conductor is disposed adjacent to the first conductor and the second conductor, is disposed on the first electrode and the second electrode, and receives an input signal.

According to one embodiment of the present invention, a semiconductor device includes a first gate conductor, a first conductor, second conductor, a first output conductor, and a second output conductor. The first gate conductor receives an input signal. The first gate conductor having a first side, a second side opposite the first side, a first end, and a second end opposite the first end. The first gate conductor is connected to a first electrode and a second electrode. The first conductor is connected to the first electrode, disposed along the first side and at the first end of the first gate conductor, and receives a first power supply signal. The second conductor is connected to the second electrode, disposed along the second side and at the second end of the first gate conductor, and receives a second power supply signal. A first voltage value of the first power supply signal is greater than a second voltage of the second power supply signal. Disposing the first conductor along the first side and at the first end of the first gate conductor, and disposing the second conductor along the second side and at the second end of the first conductor mitigates formation of parasitic devices within the semiconductor device electrically connecting the first conductor with the second conductor. The first output conductor is disposed along the second side and at the first end of the first gate conductor. The second output conductor is disposed along the first side and at the second end of the first gate conductor.

According to one embodiment of the present invention, a semiconductor device includes first conductors and second conductors. The first conductors are disposed in a first region of the semiconductor device and receive a first power supply signal. The second conductors are disposed in a second region of the semiconductor device and configured to receive a second power supply signal. The first region is opposite the second region in a first direction and a center line of the semiconductor device is between the first region and the second region in a top-down view. A first one of the first conductors is offset from a first one of the second conductors in a second direction perpendicular the first direction to mitigate formation of parasitic devices within the semiconductor device electrically connecting the first one of the first conductors with the first one of the second conductors. A voltage value of the first power supply signal is greater than a voltage value of the second power supply signal.

DETAILED DESCRIPTION

Semiconductor devices having defects may also experience failures that may cause the semiconductor devices to operate differently than expected. The failures include operational failures in which the semiconductor devices fail to operate as expected. In one example, semiconductor devices experiencing failures may cease operation due to a catastrophic failure. An example failure is when a current path is provided between the power supply rails of a semiconductor device, referred to as latch-up. The current path may be provided by parasitic devices (e.g., parasitic transistors) formed within the semiconductor device. For example, when the semiconductor device is a complementary metal-oxide-semiconductor (CMOS) device, parasitic transistors are formed between the P-type and N-type conductors. The parasitic devices (e.g., parasitic transistors) provide a current path between the power supply rails of the CMOS device. The current path allows for latch-up to occur. For example, when a sharp voltage increase (e.g., a voltage spike) occurs on either power supply rail, latch-up may occur. Accordingly, the corresponding semiconductor device may experience a failure causing the semiconductor device to operate differently than expected.

In the following, a semiconductor layout is described that mitigates occurrence of latch-up. For example, the conductors of the semiconductor device associated with the power supply rails are offset (staggered) from each other, mitigating the occurrence of latch-up within the semiconductor device. In one example, conductors of a first power supply rail (e.g., VDD) are offset from the conductors associated with a second power supply rail (e.g., VSS). Accordingly, the magnitude of the voltage spikes required to generate a current path between the power supply rails is increased, mitigating the occurrence of latch-up within the semiconductor device.

Figure 1A:
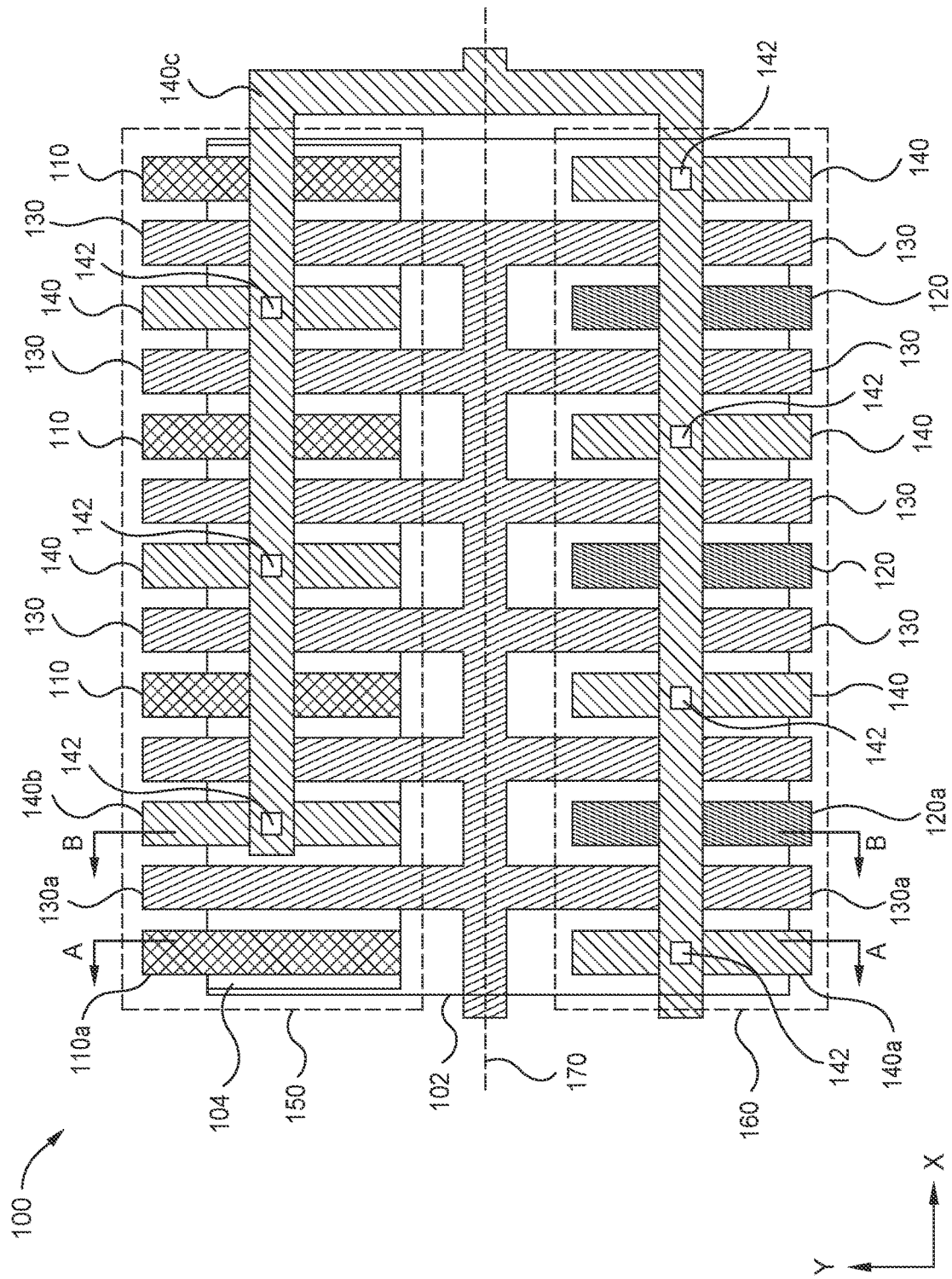
FIG. 1A illustrates a top down view of an example semiconductor device, according to one or more examples.

FIG. 1A illustrates a top-down view of the layout of a semiconductor device 100, according to one or more examples. The semiconductor device 100 is an integrated circuit (IC) device. In one example, the semiconductor device 100 is an inverter cell of a standard cell library. The semiconductor device 100 includes substrate 102. The substrate 102 includes an N-well region 104. The substrate 102 is a P-type substrate. The semiconductor device 100 further includes conductors 110, conductors 120, conductors 130, and conductors 140. The conductors 110 and a portion of the output conductors 140 are formed on the N-well region 104. The conductors 120 and a portion of the output conductors 140 are formed on the substrate 102. In one example, the semiconductor device 100 is a CMOS device.

Figure 1B:
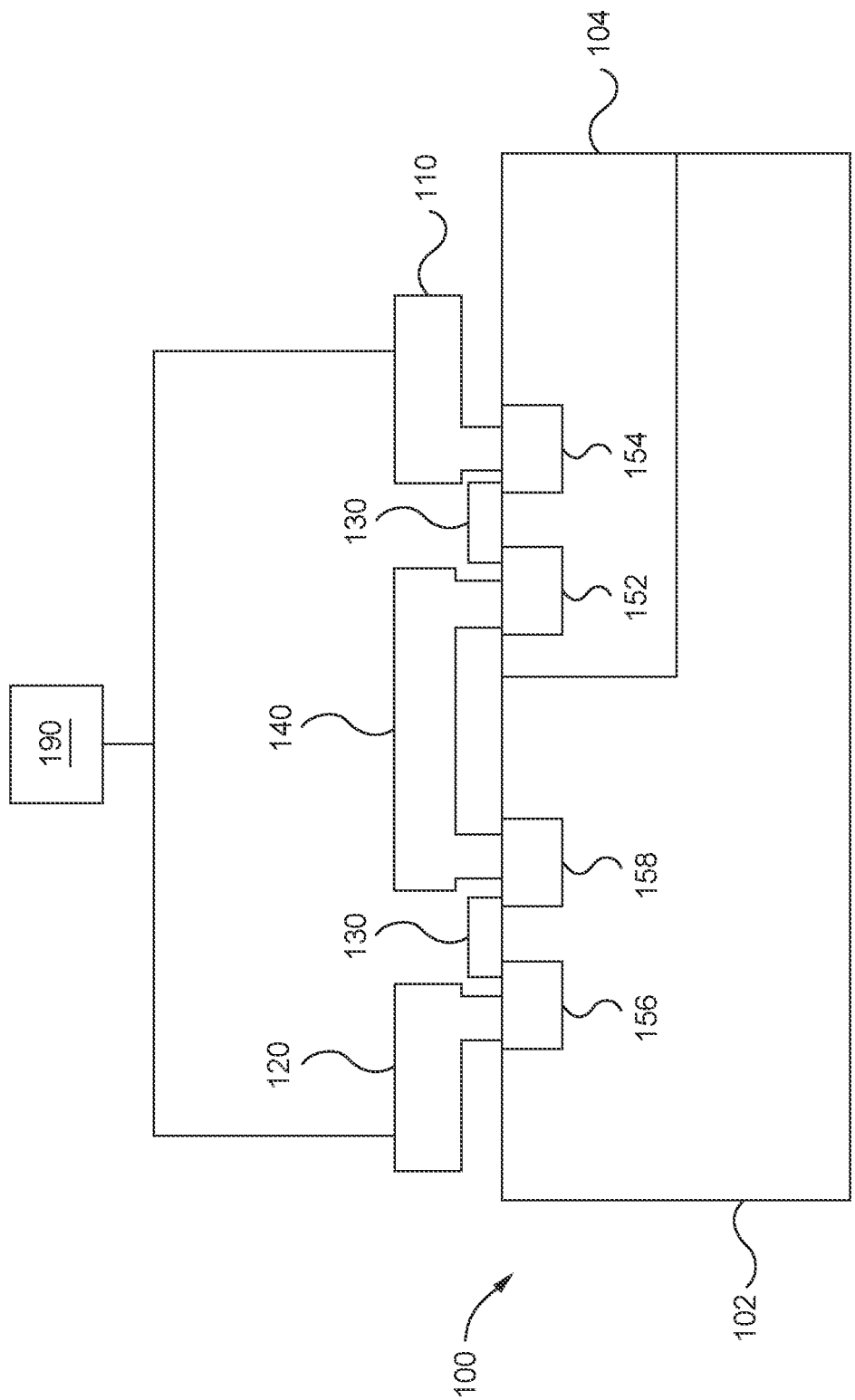
FIG. 1B illustrates a side view of an example semiconductor device, according to one or more examples.

The conductors 110 are electrically connected to P-type electrodes (P-type electrodes 154 of FIG. 1B) disposed in the N-well region 104. FIG. 1B illustrates a cross-sectional view of the semiconductor device 100. Each of the conductors 110 is electrically connected to a respective P-type electrode 154. As shown in FIG. 1B, the conductors 110 are electrically connected to a power supply (e.g., the power supply 190 of FIG. 1B) and receive a first power supply signal from the power supply. The conductors 110 couple the first voltage signal to the P-type electrodes (e.g., the P-type electrode 154).

The conductors 120 are electrically connected to N-type electrodes (e.g., N-type electrode 156 of FIG. 1B) disposed within substrate 102. Each of the conductors 120 is electrically connected to a respective N-type electrode 156. The conductors 120 are electrically connected to a power supply (e.g., the power supply 190 of FIG. 1B) and receive a second power supply signal from the power supply. The conductors 120 couple the second voltage signal to the N-type electrodes.

The conductors 110 and 120 can be connected to the same power supply or to different power supplies. In another example, the conductors 110 and 120 are connected to different power supplies. Further, the first voltage signal is greater than the second voltage signal. In one example, the first voltage signal has a voltage value in a range of about 0.5 V to about 5 V. The second voltage signal has a voltage in a range of about 0 V to about −5 V. In one example, the second voltage signal is a reference signal (e.g., a ground signal). In one example, the first voltage signal and/or the second voltage signals are direct current (DC) voltage signals.

Further, the semiconductor device 100 includes gate conductors 130. The gate conductors 130 are disposed on (e.g., stacked on) the substrate 102. A portion of the gate conductors 130 are disposed on the N-well region 104. The gate conductors 130 are disposed over and adjacent to P-type electrodes (e.g., the P-type electrodes 152 and 154 of FIG. 1B) in the N-well region 104 and over and adjacent to N-type electrodes (e.g., the N-type electrodes 156 and 158 of FIG. 1B) in the substrate 102. In one example, the gate conductors 130 include multiple different conductors connected with each other through vias. The gate conductors 130 control whether the output of the semiconductor device 100 is based on the first voltage signal provided by the conductors 110 or the second voltage signal provided by the conductors 120. For example, the gate conductors 130 are coupled to pairs of P-type electrodes (e.g., the P-type electrodes 152 and 154 of FIG. 1B) and pairs of N-type electrodes (e.g., the N-type electrodes 156 and 158 of FIG. 1B). In one example, based on the gate conductors 130 receiving an input signal having a high voltage value (e.g., a logic value of 1), the output signal is generated from the conductors 120. Further, based on the gate conductors 130 receiving an input signal having a low voltage value (e.g., a logic value of 0), the output signal is generated from the conductors 110.

The conductors 110 and the gate conductors 130 are coupled to P-type electrodes (e.g., the P-type electrodes 152 and 154) to form transistors of a first type (e.g., P-type). Further, the conductors 120 and the gate conductors 130 are coupled to N-type electrodes (e.g., the N-type electrodes 156 and 158) to form transistors of a second type (e.g., N-type).

The semiconductor device 100 further includes output conductors 140 disposed on (e.g., stacked on) the substrate 102. A portion of the output conductors 140 are disposed on the N-well region 104. The output conductors 140 are connected to each other via conductor 140c. For example, each of the output conductors 140 are connected to the conductor 140c through a corresponding one of the vias 142. Further, the output conductors 140 are connected to P-type electrodes (e.g., the P-type electrode 152 of FIG. 1B) in the N-well region 104 and to N-type electrodes (e.g., the N-type electrode 158 of FIG. 1B) in the substrate 102.

The output conductors 140 provide an output signal via the conductor 140c based on whether the conductors 110 or the conductors 120 are enabled according to the voltage on the gate conductors 130. For example, based on the gate conductors 130 receiving a voltage signal having a high voltage value (e.g., a logic value of 1), the output signal is generated from the conductors 120. Further, based on the gate conductors 130 receiving a voltage signal having a low voltage value (e.g., a logic value of 0), the output signal is generated from the conductors 110.

The conductors 110 and the conductors 120 are disposed in different regions of the substrate 102. For example, the conductors 110 are disposed in region 150 and the conductors 120 are disposed in region 160. The region 150 is along an opposite side of the semiconductor device 100 from the region 160. Further, the region 150 and the conductors 110 are disposed on a first side of the center line 170 and the region 160 and the conductors 120 are disposed on a second side of the center line 170. The region 150 and the conductors 110 and the region 160 and the conductors are on opposite sides of the center line 170. The center line 170 bifurcates the substrate 102 in the X direction into two halves.

As illustrated in FIG. 1A, the conductors 110 and the conductors 120 extend in a first direction (e.g., the Y direction) and are offset (e.g., staggered) from each other in a second direction (e.g., the X direction). The first and second directions are perpendicular from each other. Further, one of the gate conductors 130 is disposed between the conductors 110 and the conductors 120 in the second direction. For example, the gate conductor 130*a* is disposed between the conductor 110*a* and the conductor 120*a* in the second direction (e.g., the X direction). Each of the conductors 110 is diagonal from a respective one of the conductors 120, such that the conductors 110 and 120 are diagonally disposed with each other. In one example, a one of the conductors 110 (e.g., the conductor 110*a*) is disposed along a first side of one of the gate conductors 130 (e.g., the gate conductor 130*a*) and one of the conductors 120 (e.g., the conductor 120*a*) is disposed along a second side of the one of the gate conductors 130. The first side is opposite the second side. Further, the one of the conductors 110 is disposed at a first end of the one of the gate conductors 130, and the one of the conductors 120 is disposed along a second end of one of the gate conductors 130. The first end is opposite the second end. In one or more examples, the conductors 110 are offset from the conductors 120 by at least one gate pitch of the gate conductors 130 in the X direction.

The conductor 140*a* is disposed across from the conductor 110*a* in the first direction (e.g., the Y direction) and along a first side of a gate conductor 130*a*. Further, the conductor 140*b* is disposed across from the conductor 120*a* in the first direction and along a second side of the gate conductor 130*a*. Further, the conductor 140*a* and the conductor 110*a* are disposed at a first end of the gate conductor 130*a*, and the conductor 140*b* and the conductor 120*a* are disposed at a second end of the gate conductor 130*a*. The first side of the gate conductor 130*a* is opposite the second side of the gate conductor 130*a*. Further, the first end of the gate conductor 130*a* is opposite the second end of the gate conductor 130*a*.

In one example, the semiconductor device 100 includes a larger number of the conductors 110 than the conductors 120. In another example, the semiconductor device 100 includes a larger number of the conductors 120 than the conductors 110. In one example, the conductors 110 are disposed along first and second edges of the semiconductor device 100 and the output conductors 140 are disposed along the first and second edges of the semiconductor device 100. In such an example, the conductors 120 are not disposed along the first and second edges of the semiconductor device 100. In one example, the output conductors 120 are disposed along the first and second edges of the semiconductor device 100 and the conductors 140 are disposed along the first and second edges of the semiconductor device 100.

Offsetting the conductors 110 from the conductors 120 mitigates the occurrence of latch-up in the semiconductor device 100 and other logic devices. Latch-up refers to a connection formed between power supply nodes, or rails, within a semiconductor device. Latch-up may lead to high currents flowing within the semiconductor device and damage to the semiconductor device. With reference to CMOS transistor devices, latch-up occurs when a low impedance path is formed between power supply rails (e.g., a high voltage supply rail and a reference, or ground, supply rail) due to a current path generated by parasitic devices (e.g., parasitic transistors) within the CMOS transistor device. The structure formed by the parasitic devices (e.g., parasitic transistors) is a Silicon Controlled rectifier, or a thyristor. The parasitic devices (e.g., parasitic transistors) form a voltage feedback loop, forming a current path between the power supply rails. The connection between the power supply rails results in the flow of excessive current that can damage the semiconductor device.

The offsetting of the conductors 110 and 120 as described with regard to FIG. 1A may be applied to other types of logic to mitigate latch-up in such devices. For example, the methods of offsetting the conductors may be applied to NAND and/or NOR logic gates to mitigate the occurrence of latch-up in the logic gates. Further, in different examples, the number of conductors 110 and 120 may be varied from that illustrated in FIG. 1A. In one example, a semiconductor device includes one conductor 110 and one conductor 120, separated by a single gate conductor 130, and two output conductors 140. In such an example, the conductor 110 is offset from the conductor 120 as is described above. In other examples, a semiconductor device includes one or more conductors 110, one or more conductors 120, one or more gate conductors 130, and one or more output conductors 140.

As is noted above, FIG. 1B illustrates a cross-sectional view of the semiconductor device 100. For ease of understanding, FIG. 1B includes both of the conductors 110 and 120 within the cross-sectional view. However, as is shown in the cross-sections of FIGS. 3A and 3B, the conductors 110 and 120 are offset from each other, and corresponding P-type and N-type electrodes 154 and 156 would be omitted or shown in phantom.

Figure 2:
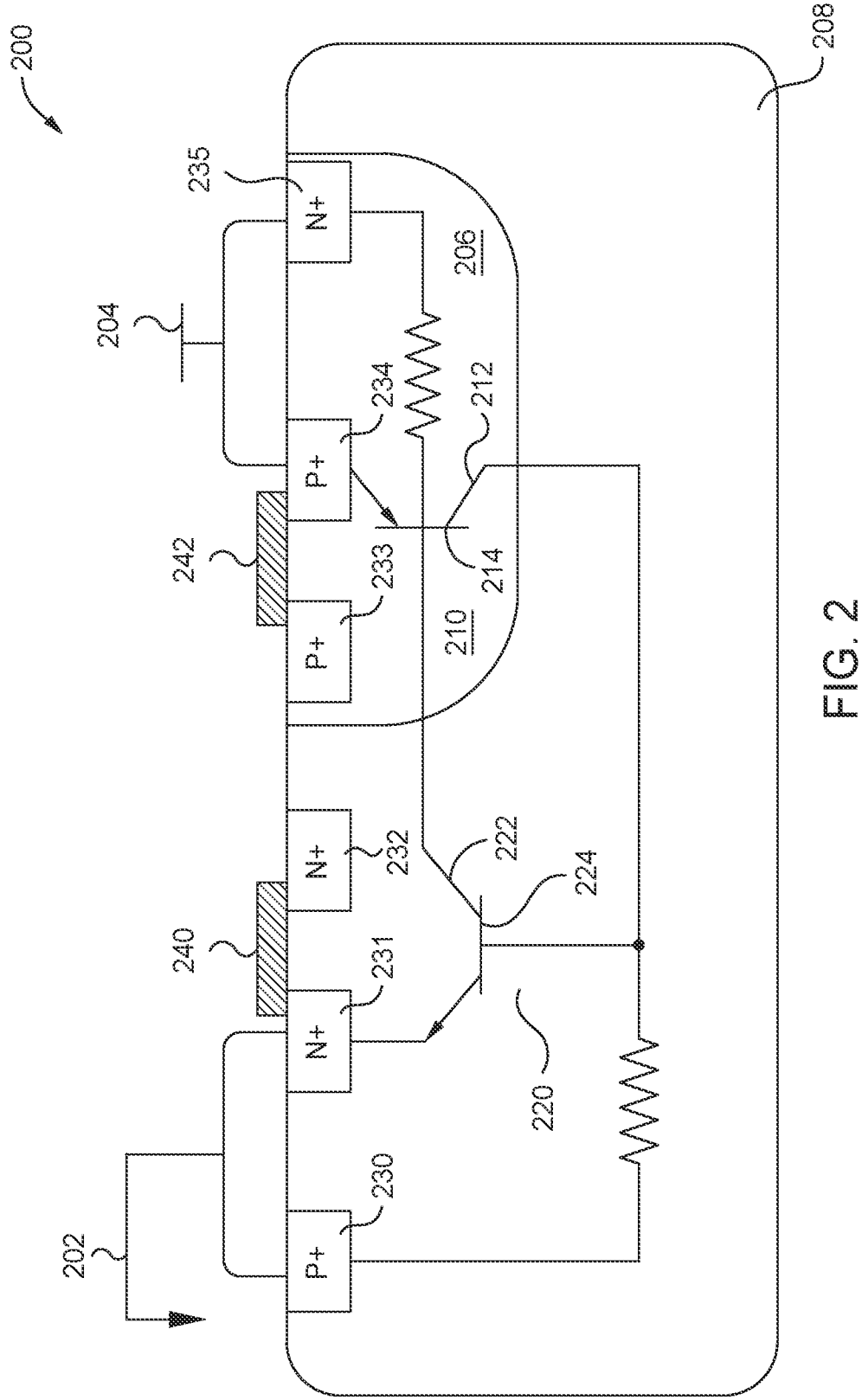
FIG. 2 illustrates an example semiconductor device with parasitic transistors, according to one or more examples.

FIG. 2 illustrates a cross-section of a CMOS device 200, and the formation of latch-up within the CMOS device 200. The CMOS device 200 includes a P-type substrate 208 and N-well region 206 formed within the P-type substrate 208. Further, the CMOS device 200 includes P-type and N-type electrodes 230-235, and gate conductors 240 and 242. In the CMOS device 200, parasitic transistors (e.g., parasitic devices) 210 and 220 are formed. The parasitic transistor 210 is a pnp transistor formed by electrode 234, the N-well region 206, and the P-type substrate 208. The parasitic transistor 220 is an npn transistor formed by the N-type electrodes 231, the P-type substrate 208 and the N-well region 206. The parasitic transistors 210 and 220 form a positive feedback loop and a Silicon Controlled rectifier. In one example, the positive feedback loop is formed based on a sharp increase (e.g., a spike) in voltage at the input 202 or 204. The sharp increase in voltage at the input 202 or 204 can forward bias the junction to initiate the feedback loop, and may cause failure within the CMOS device 200. In one example, an increase in a collector 212, 222 current of either of the parasitic transistors 210 or 220 results in a feedback loop and current perturbation. The collector current of the transistor 210 is the input base 224 current of the transistor 220, and the collector current of the transistor 220 is the input base 214 current to the transistor 210, forming a feedback loop between the transistors 210 and 220. The feedback loop allows for a high saturation current to be conducted within the IC device, causing damage to the IC device.

In one example, as is illustrated in FIG. 1A, offsetting the input conductors (e.g., the conductors 110 and 120) from each other, increasing the distance between the input conductors, mitigates the formation of parasitic transistors within the semiconductor device, mitigating the occurrence of latch-up within the semiconductor device. The input 202 corresponds to the conductors 120 of FIG. 1A and the input 204 corresponds to the conductors 110. Accordingly, increasing the distance between the inputs 202 and 204 by offsetting the inputs 202 and 204 as described with regard to conductors 110 and 120 of FIG. 1A, mitigates the gain of the parasitic transistors and the occurrence of latch-up within the CMOS device 200. Mitigating the gain of the parasitic transistors, mitigates the formation of a current path within the semiconductor device.

Figure 3A:
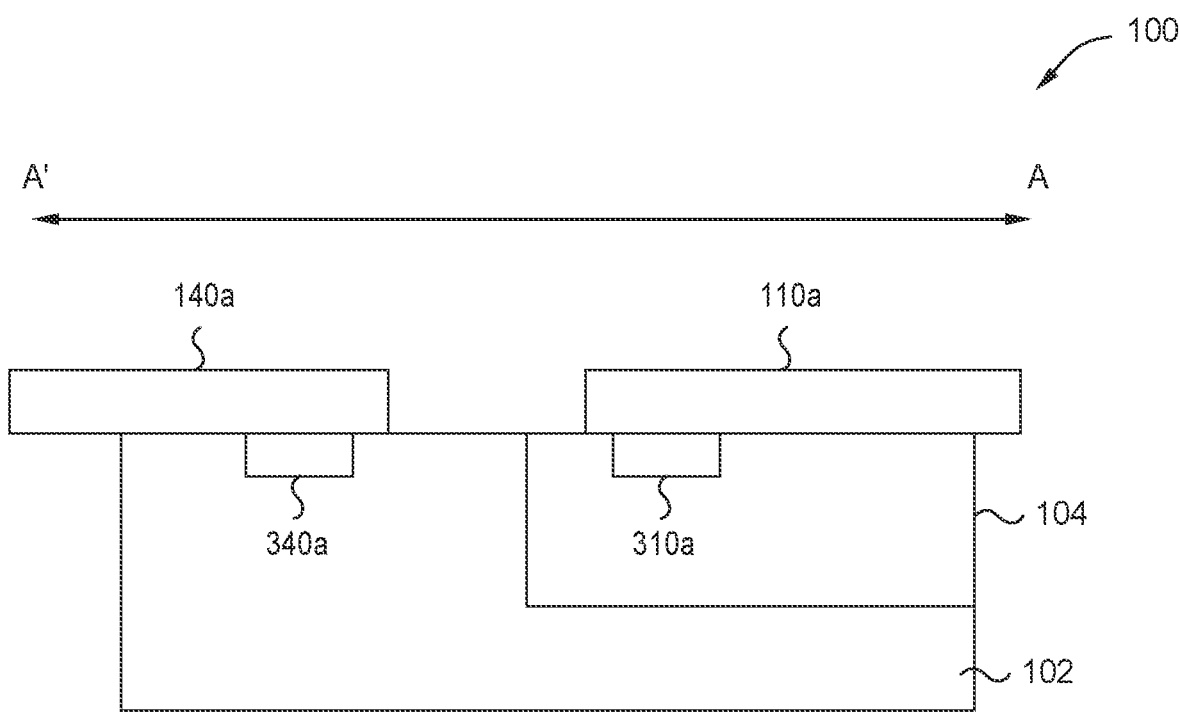
FIG. 3A illustrates a cross-section of an example semiconductor device, according to one or more examples.

FIG. 3A illustrates a portion of the semiconductor device 100 along cross-section A-A' in FIG. 1A. The semiconductor device 100 includes the conductors 110*a* and 140*a*. The conductor 110a is electrically connected to the P-type electrode 310a of the N-well region 104. Further, the output conductor 140a is electrically connected to the electrode 340a within the substrate 102. In FIG. 3A, the conductors 120 are not illustrated as the conductors 120 are offset from the conductors 110 to mitigate latch-up as is described above with regard to FIG. 1A.

Figure 3B:
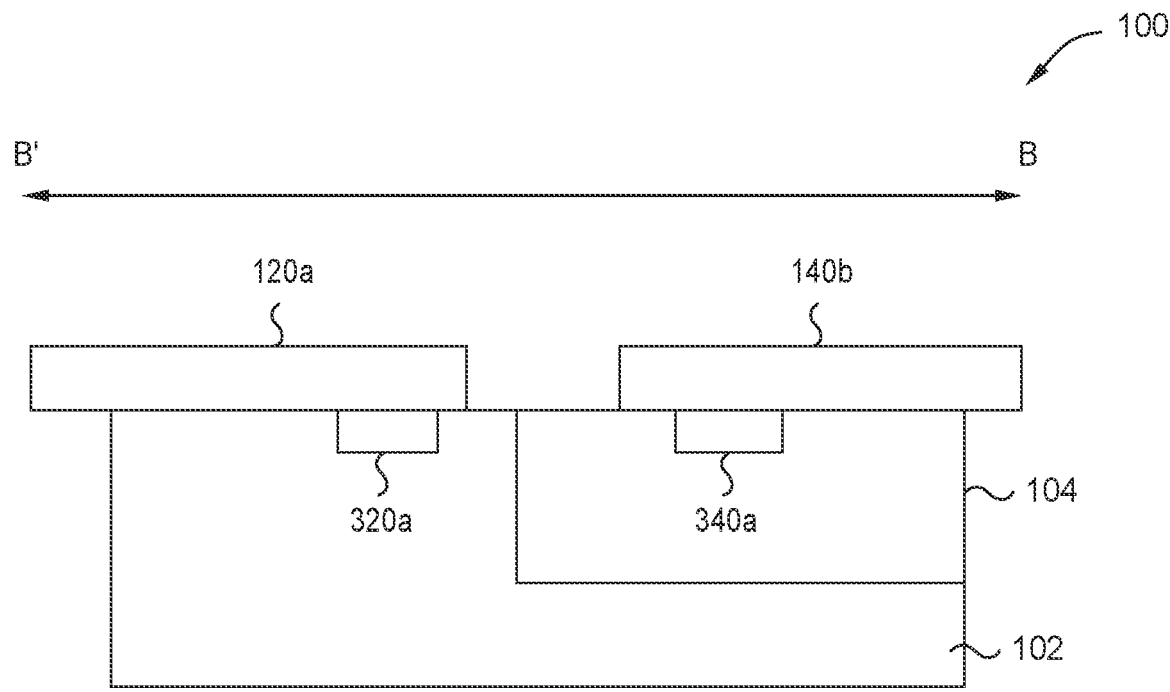
FIG. 3B illustrates a cross-section of an example semiconductor device, according to one or more examples.

FIG. 3B illustrates a portion of the semiconductor device 100 along cross-section B-B' in FIG. 1A. The semiconductor device 100 includes the conductors 120a and 140b. The conductor 120a is electrically connected to the N-type electrode 320a of the substrate 102. Further, the output conductor 140b is electrically connected to the electrode 340a within the N-well region 104 of the P-type substrate 102. In FIG. 3B, the conductors 110 are not illustrated as the conductors 120 are offset from the conductors 110 to mitigate latch-up as is described above with regard to FIG. 1A.

Figure 4:
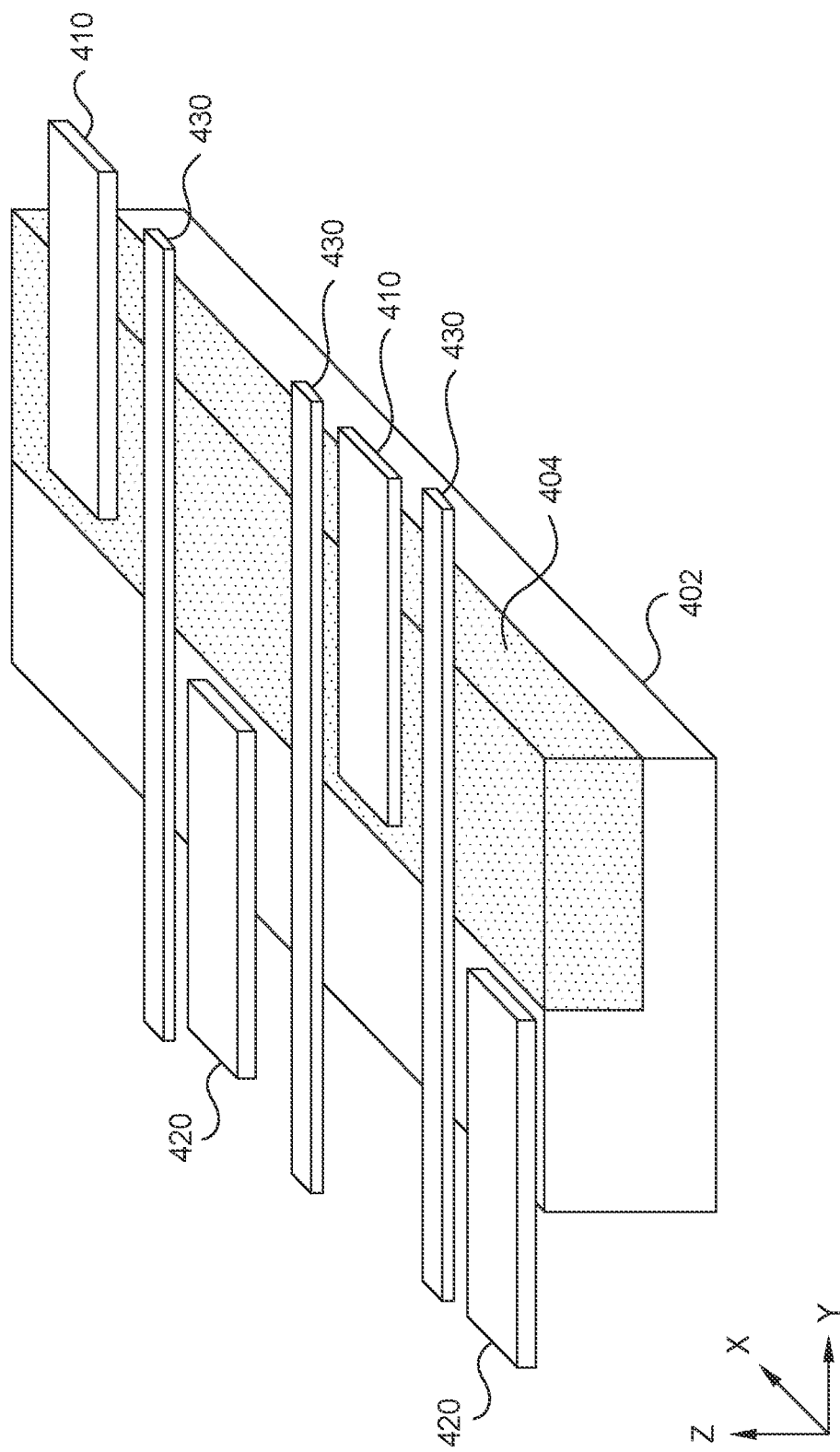
FIG. 4 illustrates an example semiconductor device, according to one or more examples.

FIG. 4 illustrates a portion of a semiconductor device 400, according to one or more examples. The semiconductor device 400 includes substrate 402. The substrate 402 is a P-type substrate. The substrate 402 includes an N-well region 404. Further, the semiconductor device 400 includes conductors 410, 420, and 430. The conductors 410 are configured similar to that of the conductors 110 of FIG. 1A. The conductors 420 are configured similar to that of the conductors 120 of FIG. 1A. Further, the conductors 430 are configured similar to that of the conductors 130 of FIG. 1A. The conductors 410 and 430 are used by a first type of transistor and the conductors 420 and 430 are used by a second type of transistor different from the first type of transistor.

As is described with regard to FIG. 1A, the conductors 410, the conductors 420, and the conductors 430 extend in a first direction (e.g., the Y direction). Further, the conductors 410 and 420 are offset from each other in a second direction (e.g., the X direction). Accordingly, as is noted above, a gate conductor 430 is disposed between adjacent ones of the conductors 410 and 420.

Figure 5A:
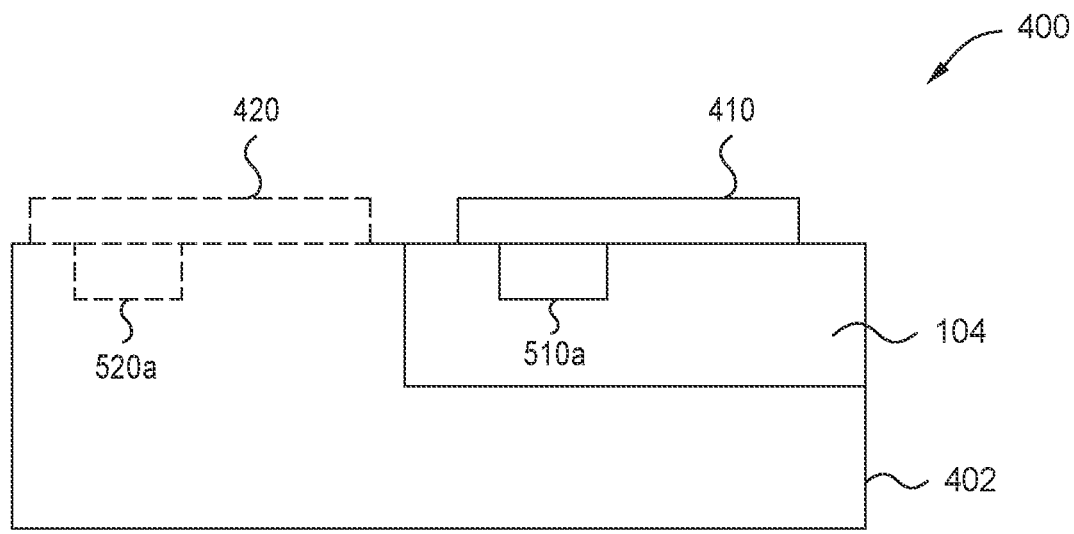
FIG. 5A illustrates a cross-section of an example semiconductor device, according to one or more examples.

FIG. 5A illustrates a cross-sectional view of the semiconductor device 400 taken along the conductor 410. In FIG. 5A, the conductor 410 is electrically connected to the P-type electrodes 510a in the N-well region 404 of the P-type substrate 402. As is described with regard to FIG. 4, the conductor 410 is offset from the conductor 420, accordingly, the conductor 420 and corresponding N-type electrodes 520a are illustrated as being in phantom in FIG. 5A.

Figure 5B:
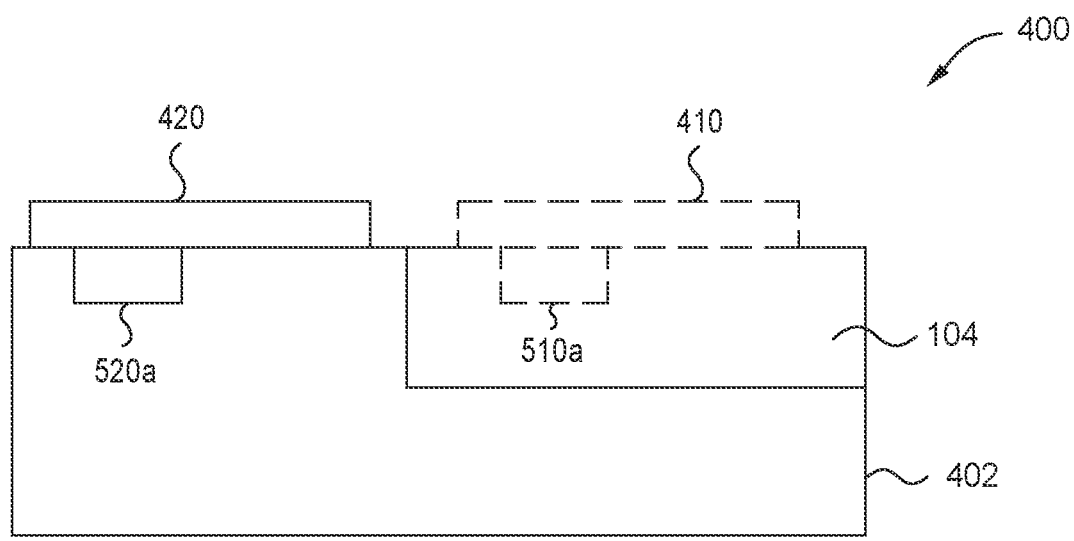
FIG. 5B illustrates a cross-section of an example semiconductor device, according to one or more examples.

FIG. 5B illustrates a cross-sectional view of the semiconductor device 400 taken along the conductor 420. In FIG. 5B, the conductor 420 is electrically connected to the N-type electrodes 520a of the P-type substrate 402. As is described with regard to FIG. 4, the conductor 420 is offset from the conductor 410, accordingly, the conductor 420 and corresponding N-type electrodes 520a are illustrated in phantom in FIG. 5B.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

While the foregoing is directed to embodiments of the present invention, other and further embodiments of the invention may be devised without departing from the basic scope thereof, and the scope thereof is determined by the claims that follow.

What is claimed is:

1. A semiconductor device comprising:
   a first conductor extending in a first direction and configured to receive a first power supply signal, the first conductor is connected to a first electrode;
   a second conductor extending in the first direction and configured to receive a second power supply signal, the second conductor is connected to a second electrode, the first conductor offset from the second conductor in a second direction perpendicular to the first direction in a top-down view to mitigate formation of parasitic devices within the semiconductor device electrically connecting the first conductor with the second conductor, and wherein a first voltage value of the first power supply signal is greater than a second voltage of the second power supply signal;
   a first output conductor extending in the first direction and connected to a third electrode;

a second output conductor extending in the first direction and offset from the first conductor in the second direction and connected to a fourth electrode, the first output conductor is connected to the second output conductor; and a first gate conductor disposed between the first conductor the first output conductor, and between the second conductor and the second output conductor, disposed on the first electrode, the second electrode, the third electrode and the fourth electrode, and configured to receive an input signal.

2. The semiconductor device of claim 1, wherein the first conductor is disposed along a first side of the first gate conductor and the second conductor is disposed along a second side of the first gate conductor, the second side is opposite the first side.

3. The semiconductor device of claim 2, wherein the first conductor is disposed at a first end of the first gate conductor and the second conductor is disposed at a second end of the first gate conductor, the first end is opposite the second end.

4. The semiconductor device of claim 1, wherein the first conductor is disposed opposite the second output conductor and the second conductor is disposed opposite the first output conductor.

5. The semiconductor device of claim 1 further comprising a substrate, wherein the first conductor is disposed on a first region of the substrate and the second conductor is disposed on a second region of the substrate, wherein the first region is associated with a first side of the substrate and the second region is associated with a second side of the substrate opposite the first side.

6. The semiconductor device of claim 1 further comprising:
a P-type substrate comprising an N-well region, wherein the first electrode is a P-type electrode disposed within the N-well region, and the second electrode is an N-type electrode disposed within the P-type substrate.

7. The semiconductor device of claim 1 further comprising:
a third conductor configured to receive the first power supply signal and extending in the first direction, the third conductor is disposed on a fifth electrode;
a fourth conductor configured to receive the second power supply signal and extending in the first direction, the fourth conductor is disposed on a sixth electrode, wherein the third conductor is offset from the fourth conductor in the second direction; and
a second gate conductor is disposed between the third conductor and the fourth conductor, connected to the fifth electrode and the sixth electrode, and configured to receive the input signal.

8. The semiconductor device of claim 7 further comprising a third gate conductor disposed between the second conductor and the third conductor.

9. The semiconductor device of claim 1, wherein the first conductor and the first output conductor are disposed along a first end of the first gate conductor.

10. The semiconductor device of claim 9, wherein the second conductor and the second output conductor are disposed along a second end of the first gate conductor.

11. A semiconductor device comprising:
a first gate conductor configured to receive an input signal, the first gate conductor having a first side, a second side opposite the first side, a first end, and a second end opposite the first end, the first gate conductor is connected to a first electrode, a second electrode, a third electrode and a fourth electrode;

a first conductor connected to the first electrode, disposed along the first side and at the first end of the first gate conductor, and configured to receive a first power supply signal;

a second conductor connected to the second electrode, disposed along the second side and at the second end of the first gate conductor, and configured to receive a second power supply signal, wherein a first voltage value of the first power supply signal is greater than a second voltage of the second power supply signal, and wherein disposing the first conductor along the first side and at the first end of the first gate conductor, and disposing the second conductor along the second side and at the second end of the first conductor mitigates formation of parasitic devices within the semiconductor device electrically connecting the first conductor with the second conductor;

a first output conductor disposed along the second side and at the first end of the first gate conductor and connected to the third electrode; and a second output conductor disposed along the first side and at the second end of the first gate conductor and connected to the fourth electrode, the first output conductor is connected to the second output conductor.

12. The semiconductor device of claim 11, wherein the first conductor is disposed opposite the second output conductor and the second conductor is disposed opposite the first output conductor.

13. The semiconductor device of claim 11 further comprising a substrate, wherein the first conductor is disposed in a first region of the substrate and the second conductor is disposed in a second region of the substrate, wherein the first region is associated with a first side of the substrate and the second region is associated with a second side of the substrate opposite the first side of the substrate.

14. The semiconductor device of claim 11 further comprising:
a P-type substrate comprising an N-well region, the first electrode is a P-type electrode disposed within the N-well region, and the second electrode is an N-type electrode disposed within the P-type substrate.

15. The semiconductor device of claim 11 further comprising:
a second gate conductor configured to receive the input signal, the second gate conductor having a first side, a second side opposite the first side, a first end, and a second end opposite the first end, the second gate conductor connected to a fifth electrode and a sixth electrode;
a third conductor connected to the fifth electrode, disposed along the first side and at the first end of the second gate conductor, and configured to receive the first power supply signal; and
a fourth conductor connected to the sixth electrode, disposed along the second side and at the second end of the second gate conductor, and configured to receive the second power supply signal.

16. The semiconductor device of claim 15 further comprising:
a third output conductor disposed along the second side and at the first end of the second gate conductor; and
a fourth output conductor disposed along the first side and at the second end of the second gate conductor.

17. A semiconductor device comprising:
first conductors disposed in a first region of the semiconductor device and configured to receive a first power supply signal;

second conductors disposed in a second region of the semiconductor device and configured to receive a second power supply signal, the first region is opposite the second region in a first direction and a center line of the semiconductor device is between the first region and the second region in a top-down view, wherein a first one of the first conductors is offset from a first one of the second conductors in a second direction perpendicular the first direction to mitigate formation of parasitic devices within the semiconductor device electrically connecting the first one of the first conductors with the first one of the second conductors, and wherein a voltage value of the first power supply signal is greater than a voltage value of the second power supply signal;

output conductors, a first one of the output conductors is disposed in the first region and a second one of the output conductors is disposed in the second region, the first one of the output conductors is connected to a second one of the output conductors; and gate conductors, a first one of the gate conductors is disposed between the first one of the first conductors and the first one of the output conductors and between the first one of the second conductors and the second one of the output conductors.

18. The semiconductor device of claim 17, wherein the gate conductors are configured to receive an input signal, and wherein the first one of the first conductors is disposed along a first side and a first end of the first one of the gate conductors, and the first one of the second conductors is disposed along a second side and a second end of the first one of the gate conductors.

19. The semiconductor device of claim 18, wherein the first one of the output conductors is disposed along the second side and the first end of the first one of the gate conductors, and the second one of the output conductors is disposed along the first side and the second end of the first one of the gate conductors.

20. The semiconductor device of claim 18, wherein each of the gate conductors are disposed at a gate pitch from each other, and wherein each of the first conductors is disposed offset from each of the second conductors.

* * * * *